(12) United States Patent
Kanda et al.

(10) Patent No.: US 7,416,763 B2
(45) Date of Patent: Aug. 26, 2008

(54) PROCESS FOR FORMING METAL LAYERS

(75) Inventors: Yuichi Kanda, Aizuwakamatsu (JP); Takashi Abe, Ichikawa (JP); Atsushi Tanaka, Tokyo (JP); Keisuke Nishu, Tokyo (JP)

(73) Assignee: Cookson Electronics Co., Kanagawa (JP)

( * ) Notice: Subject to any disclaimer, the term of this patent is extended or adjusted under 35 U.S.C. 154(b) by 823 days.

(21) Appl. No.: 10/870,671

(22) Filed: Jun. 16, 2004

(65) Prior Publication Data

US 2005/0097735 A1 May 12, 2005

(30) Foreign Application Priority Data

Jun. 18, 2003 (JP) .............................. 2003-173705

(51) Int. Cl.
*B05D 1/36* (2006.01)
*B05D 7/00* (2006.01)

(52) U.S. Cl. ................. 427/402; 427/99.5; 427/252; 427/258; 427/404; 427/405; 427/407.1; 427/409; 427/437; 427/443.1

(58) Field of Classification Search ............... 427/99.5, 427/252, 258, 404, 405, 407.1, 409, 437, 427/443.1, 402
See application file for complete search history.

(56) References Cited

U.S. PATENT DOCUMENTS 4,269,897 A * 5/1981 Gans et al. ................. 428/419

| 4,728,399 | A | * | 3/1988 | Moehwald | ................. | 205/188 |
| 6,015,613 | A | * | 1/2000 | Kinlen et al. | ................. | 428/332 |
| 6,045,713 | A | | 4/2000 | Tamiya et al. | ................. | 216/13 |
| 6,093,499 | A | | 7/2000 | Tomioka | ................. | 428/606 |
| 2002/0155021 | A1 | | 10/2002 | Nagai | ................. | 420/492 |
| 2006/0070870 | A1 | * | 4/2006 | Schettler et al. | ................. | 204/192.15 |

FOREIGN PATENT DOCUMENTS

| EP | 1180917 | 2/2002 |
| JP | 63312936 | 12/1988 |
| JP | 2270946 | 6/1990 |
| JP | H5-287582 | 11/1993 |
| JP | H6-81190 | 3/1994 |
| JP | 10081927 | 3/1998 |
| JP | 200282156 | 10/2000 |
| JP | 2001-85397 | 3/2001 |
| JP | 2001131661 | 5/2001 |

OTHER PUBLICATIONS

Office Action with English language translation from corresponding Japanese application No. 2003-173705, mailed on Dec. 21, 2007.

* cited by examiner

*Primary Examiner*—Elena Tsoy
(74) *Attorney, Agent, or Firm*—Kolisch Hartwell, P.C.

(57) ABSTRACT

A process in which a base metal film is formed on the surface of a plastic film using a dry plating process, and a liquid containing an organic monomer is then brought in contact with the base metal film, thereby selectively forming a conductive organic polymer coating within any pinhole defects, and effectively filling the defects. A metal film is then formed on top of the base metal film using an electroplating process, thus forming a metal wet plating layer.

9 Claims, 3 Drawing Sheets

PROCESS FOR FORMING METAL LAYERS

BACKGROUND OF THE INVENTION

1. Field of the Invention

The present invention relates to a metal layer formation process, for forming a metal layer with minimal defects on the surface of an insulator.

Priority is claimed on Japanese Patent Application No. 2003-173705, filed Jun. 18, 2003, the content of which is incorporated herein by reference.

2. Description of Related Art

In recent years, circuit boards that use TAB (Tape Automated Bonding) or FPC (Flexible Printed Circuit) have been identified as ideal for achieving further miniaturization and weight reductions of electronic equipment, and consequently, demand for these circuit boards continues to rise. Conventionally, these types of circuit boards have used a flexible plastic substrate, with a layer of copper foil bonded to this substrate with an adhesive such as an epoxy based adhesive. However, in order to achieve higher density packaging within electronic equipment, further reductions in the thickness of these circuit boards is now required, and the above construction, comprising a bonded layer of copper foil, is unable to adequately satisfy this requirement for further thickness reductions.

Accordingly, techniques are being investigated for forming metallized films without the use of an adhesive. For example, in one known method, a thin film formation process such as vacuum deposition, sputtering or ion plating is used to form a base metal film directly onto a plastic substrate, and a plating process or the like is then used to deposit a metal plating layer on top of the base metal film.

However, in the production method described above, the generation of a plurality of pinhole defects, with sizes ranging from several μm to several hundred μm, within the base metal film formed by the dry plating is unavoidable. If a metal plating layer is then formed on top of this type of base metal film containing pinhole defects, then even if the metal plating layer is able to seal these pinholes defects, problems can still arise, including the possibility of plating solution remaining within the pinhole defects and causing peeling of the metal film, and the chance that if a fine wiring pattern is formed on top of a pinhole defect, the wiring pattern may break.

Accordingly, Japanese Unexamined Patent Application, First Publication No. Hei 10-256700 proposes a method in which a base metal layer is formed on an insulator film using a dry plating process, a primary electroplated copper layer is formed on top of the base metal layer, the structure is then treated in an alkali solution, an electroless copper plating layer is subsequently formed on top of the primary electroplated copper layer as an intermediate layer, and finally, a secondary electroplated copper layer is formed on top of the intermediate layer.

However in this method, the base metal layer, the primary electroplated copper layer, the intermediate layer, and the secondary electroplated copper layer must be formed in sequence on the surface of the insulator film, and consequently the method is complex and the associated costs are high.

Furthermore, when forming an electroless plating layer, catalytic nuclei must be first adhered to the plating surface, and because these catalytic nuclei tend to adhere preferentially to the metal rather than the exposed insulator surface, the thickness of the electroless plating layer tends to be thinner within the pinhole defects than on the metal surface, meaning the pinhole defects cannot be completely filled. Accordingly, the occurrence of indentations in the metal layer surface at positions corresponding with the pinhole defects is unavoidable, making it difficult to form a metal layer of uniform thickness.

In addition, electroless plating processes are unable to form films as dense as those produced by electroplating processes. As a result, the surface of the electroless plating layer tends to be a rough structure with a multitude of surface irregularities, and consequently the secondary electroplated copper layer formed on top of this electroless plating layer, which reflects the surface state of the underlying electroless plating layer, is also rough, meaning the surface of the final metal layer is neither smooth nor dense.

The present invention takes the above circumstances into consideration, with an object of providing a process in which only the pinhole defects within a base metal film formed using a dry plating process can be coated selectively with a semiconductor, enabling the formation of a metal layer with excellent surface properties.

SUMMARY OF THE INVENTION

A process for forming a metal layer according to the present invention comprises the steps of forming a base metal film on the surface of an insulator using a dry plating process, and coating the pinhole defects within the base metal film by bringing a liquid containing an organic monomer into contact with the base metal film, thus selectively forming a conductive organic polymer coating on the sections of the insulator surface inside the pinhole defects.

Following coating of the pinhole defects with the conductive organic polymer coating described above, an electroplating process may be used for forming a metal film on top of the base metal film, thus forming a metal wet plating layer. This metal plating layer forms a portion of the metal layer.

According to the process for forming a metal layer described above, the plurality of pinhole defects formed in the base metal film as a result of the dry plating process can be selectively filled with a conductive organic polymer, and a conductive layer can be produced that displays a high level of smoothness and uniform electrical conductivity across the entire surface.

DETAILED DESCRIPTION OF THE INVENTION

Figure 1:
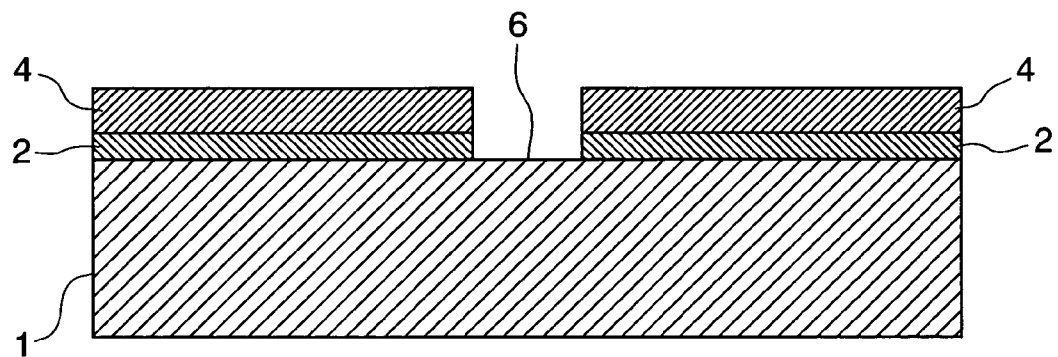
FIG. 1 is an enlarged cross sectional view showing a pinhole defect in a base metal film in an embodiment of the present invention.
Figure 2:
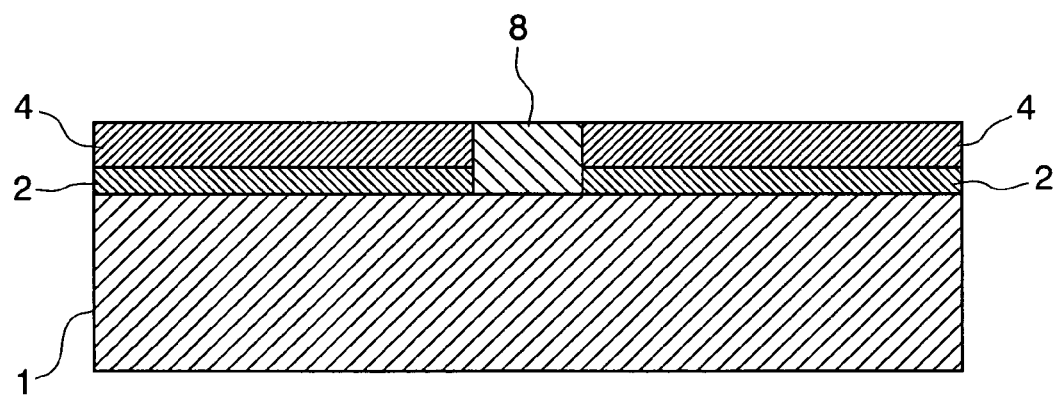
FIG. 2 is an enlarged cross sectional view showing a conductive organic polymer coating formed inside the pinhole defect in the embodiment of the present invention.
Figure 3:
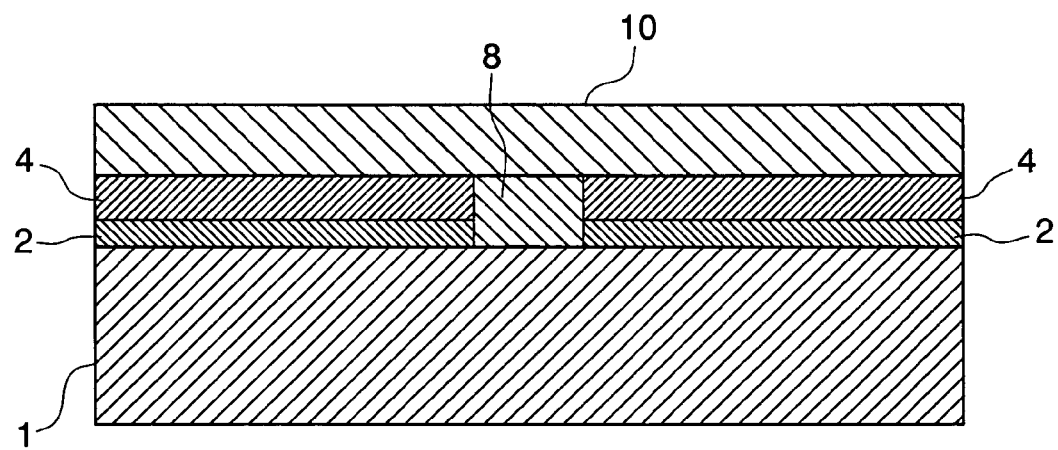
FIG. 3 is an enlarged cross sectional view showing a metal wet plating layer formed on top of the metal base layer and covered pinhole defect in the embodiment of the present invention.

As follows is a description of an embodiment of a metal layer formation process according to the present invention, with reference to FIG. 1 through FIG. 3. In the figures, numeral 1 represents an insulator, and in this embodiment, a plastic film 1 is used as one example of a suitable insulator. However, the present invention is not restricted to plastic films 1, and can also be applied to non-film type plastics such as hard plastic substrates, as well as non-plastic insulators such as ceramics, glass and rubber.

The material used for the plastic film 1 may be the type of polyimide resin that is widely used in TAB tape applications and the like. Polyimide films display good dimensional stability under conditions of heat and moisture absorption, and also provide favorable rigidity, although they display poor bonding strength to thin metal films. The polyimide film 1 may comprise a single layer, or may be a laminated film comprising a plurality of layers of different polyimide resins.

In this embodiment, a metal nucleus adhesion section 2 is formed on top of the plastic film 1, followed by a base metal film 4. The metal nucleus adhesion section 2 has the effect of improving the bonding strength between the base metal film 4 and the plastic film 1. If the base metal film 4 is able to be formed directly on top of the plastic film 1 with good bonding strength, then the metal nucleus adhesion section 2 can be omitted.

In the example shown in the drawings, the metal nucleus adhesion section 2 and the base metal film 4 are formed on only one surface of the plastic film 1, but they may also be formed on both surfaces, and may also be formed so that the metal nucleus adhesion section 2 and the base metal film 4 generate a desired pattern shape.

The material for the metal nucleus adhesion section 2 is ideally one or more materials selected from a group consisting of Mo, Cr, Ni, Si, Fe, Al, and actual alloys formed from two or more of these elements. By bonding these elements to the plastic film 1 as metal nuclei, the bonding strength of the base metal film 4 can be increased. This bonding strength improvement effect is particularly marked when the base metal film 4 is formed from copper or a copper alloy.

The metal nucleus adhesion section 2 can be formed by using a dry film formation technique such as vacuum deposition, sputtering or ion plating to bond the above nucleus forming metal to the plastic film 1. Sputtering and ion plating are particularly preferred film formation techniques for bonding the nucleus forming metal. There are no particular restrictions on the film formation conditions, although the partial pressures of oxygen and water within the film formation chamber are preferably suppressed as low as possible in order to prevent oxidation of the nucleus forming metal.

The thickness of the metal nucleus adhesion section 2 is preferably within a range from 0.2 mg/m$^2$ to 90 mg/m$^2$, and need not necessarily be a continuous, dense film. If the quantity of metal adhesion in the metal nucleus adhesion section 2 is less than 0.2 mg/m$^2$, then particularly in those cases where a polyimide film is used as the plastic film 1, increasing the bonding strength of the base metal film 4 becomes difficult. In contrast, if the metal nucleus adhesion section 2 exceeds 90 mg/m$^2$, then there is a danger that oxidation of the nucleus forming metal can actually cause a decrease in the bonding strength of the base metal film 4.

The material for the base metal film 4 is preferably one or more metals selected from a group consisting of copper, copper alloys, aluminum, aluminum alloys, silver, gold and platinum, and of these, pure copper or a copper alloy comprising nickel, zinc or iron or the like is preferred. The thickness of the base metal film 4 is preferably at least 10 nm, and even more preferably 200 nm or greater. If the base metal film 4 is overly thin, then forming a metal wet plating layer 10 of uniform thickness on top of the base metal film 4 becomes difficult. However, if the base metal film 4 is too thick, then the associated costs can become excessive.

The base metal film 4 can be formed by using a dry plating process such as vacuum deposition, sputtering or ion plating to form a film of the metal on top of the metal nucleus adhesion section 2 formed on the polyimide film 1. Of the above processes, sputtering and ion plating are particularly preferred, as they enable the bonding strength to be increased with ease. There are no particular restrictions on the film formation conditions, and the types of conditions typically used for the selected film material are suitable.

In those cases where, as described above, the metal nucleus adhesion section 2 and the base metal film 4 are formed using a dry plating process, pinhole defects 6 occur within the metal nucleus adhesion section 2 and the base metal film 4. These pinhole defects 6 extend down as far as the surface of the plastic film 1, so that the plastic film 1 is exposed within these pinhole defects 6. Most of these pinhole defects 6 have a size within a range from several μm to several hundred μm, although larger pinhole defects also exist. The pinhole defects 6 are not necessarily round, and a variety of other shapes such as slits are also possible.

In order to fill these pinhole defects 6, a liquid containing an organic monomer is brought in contact with the base metal film 4, thus forming a conductive organic polymer coating selectively on those sections of the insulator surface inside the pinhole defects within the base metal film. The liquid containing the organic monomer may be either an organic monomer solution or an emulsion.

In the present invention, the organic monomer can use an aniline, a pyrrole or a thiophene based compound, which on polymerization is capable of forming a polyacetylene based conductive polymer with consecutive conjugated double bonds.

The organic monomer polymerizes through a reaction with an oxidizing agent and an acid, thus forming a conductive organic polymer. Accordingly, by depositing an oxidizing agent on the sections of the insulator surface inside the pinhole defects 6 within the base metal, the conductive organic polymer can be formed selectively on the insulator surface. Because the conductive organic polymer does not form on the metal surface, the smoothness and mirror finish of the base metal film 4 can be retained. Furthermore, because the thickness of the conductive organic polymer coating is minimal, the surface roughness is also minimal, meaning the smoothness of the surface above the pinhole defects 6 can also be ensured.

The procedure employed for using an organic monomer to form a conductive organic polymer selectively on the insulator surface is as follows. Specifically, an ENVISION DMS-E System (a direct metallization system trademark, previously known as a Monopole DMS-E System) marketed by Enthone Inc. can be used.

First, the plastic film 1 with the base metal film 4 formed thereon is subjected to degreasing treatment, where required, to remove any mainly organic contamination from the surface, and the film is then immersed in an acidic oxidizing agent (etching) solution, thus removing the metal oxide film from the surface of the base metal film 4. The degreasing can use any of a variety of different surfactant solutions, whereas the etching can use a mixed solution of sulfuric acid and persulfate, or a mixed solution of sulfuric acid and hydrogen peroxide or the like.

Subsequently, a conditioning process is used to adsorb a surfactant to the sections of the insulator surface within the base metal film pinhole defects 6, thus imparting polarity to these surfaces. In those cases where the substrate is an inorganic material such as ceramic or glass, the surface of the substrate can be covered with an organic material to organize the surface. This conditioning enables the entire insulator surface to be more uniformly, and more effectively oxidized in the following oxidation treatment. Depending on the nature of the plastic material, if required the substrate may be subjected to alkali treatment and/or swelling treatment using a surfactant or a solvent, either prior to, or following, the conditioning process.

Next, an oxidation treatment is performed. In the oxidation treatment, the plastic film 1 is immersed in a solution containing, for example, 40 to 100 g/L of a dissolved permanganate. By conducting this oxidation treatment, the portions of the organic insulator exposed within the pinhole defects 6 formed in the base metal film 4 distributed across the plastic film 1, and the organic material adsorbed in the above conditioning process can be selectively oxidized, while the permanganate is simultaneously reduced, thus depositing manganese dioxide on the insulator surface. This manganese dioxide acts as an oxidizing agent during the organic monomer oxidation polymerization described in the following step.

Subsequently, the plastic film 1 is immersed in a liquid containing an organic monomer, thus forming a conductive organic polymer coating 8 within the pinhole defects 6. The conductive organic polymer coating 8 can be formed either by immersing the plastic film 1 in a mixed solution comprising the organic monomer and an acid, or by immersing the plastic film 1 first in a liquid containing the organic monomer, and then in an acid. For example, in the ENVISION DMS-E System (a trademark of Enthone Inc.) marketed by Enthone Inc., the conductive organic polymer coating can be formed either by immersing the plastic film 1 in a mixed solution comprising ENVISION DMS-E Catalyst 7050A (a trademark of Enthone Inc.) and ENVISION DMS-E Catalyst 7050B (a trademark of Enthone Inc.) in concentrations of 10 to 20 mL/L and 40 to 60 mL/L respectively, or by first immersing the plastic film 1 in a solution containing ENVISION DMS-E catalyst 7030 (a trademark of Enthone Inc.) at a concentration of 100 to 140 mL/L, and then immersing the plastic film 1 in an acid.

By subsequently washing the film with water and then drying, a metallized plastic film is obtained in which the insides of the pinhole defects 6 are coated with a conductive organic polymer coating 8. Because the conductive organic polymer coating 8 is not formed at all on the surface of the base metal film 4, the mirror finish of the base metal film 4 formed by the above dry plating process is retained. A surface resistance of the conductive organic polymer coating 8 may be within a range from 10 $\Omega$/cm to 1 M$\Omega$/cm. A thickness of the conductive organic polymer coating 8 may be not more than 0.2 µm.

Next, a metal wet plating layer 10 is formed on top of the conductive layer (2+4+8) using a wet plating process. This wet plating process can use either an electroplating process or an electroless plating process, although an electroplating process is preferred as the film formation rate is faster, the film formation cost is cheaper, and the surface smoothness produced is superior. If an electroplating process is used, the plastic film 1 is immersed in a wet plating solution, the conductive layer (2+4+8) is connected to the cathode of a power source, and current is allowed to flow between the cathode and an anode that is immersed in the wet plating solution, thus depositing a metal wet plating layer 10 on top of the conductive layer (2+4+8). If an electroless plating process is used, then first, deposition nuclei are bonded to the surface of the conductive layer (2+4+8) using a palladium salt solution or the like, and the plastic film 1 is then immersed in the electroless plating solution.

From the viewpoint of electrical conductivity, copper or copper alloys are preferred as the material for the metal wet plating layer 10, although other metals can also be used.

According to a metal layer formation process comprising the steps described above, a conductive organic polymer coating 8 is formed selectively within the plurality of pinhole defects 6 generated in the base metal film 4, with good retention of the surface roughness of the plastic film substrate 1, and the plating process of the subsequent steps enables the formation of a metal layer (2+4+8+10) with absolutely no defects.

Furthermore, the conductive organic polymer coating is not formed on the surface of the base metal film 4 formed by a dry plating process, enabling the mirror surface of the base metal film 4 to be retained, and consequently the metal wet plating layer 10 formed on top of the base metal film 4 reflects the state of the mirror surface, forming a dense layer with excellent smoothness. In addition, compared with conventional processes, the process of the present invention also offers the advantages of fewer steps and lower costs.

EXAMPLES

As follows, a series of examples are presented and used to validate the effects of the present invention.

Vapor deposition was used to deposit 30 mg/m$^2$ of molybdenum on a polyimide film, and a film of copper with a thickness of 300 nm was then deposited by sputtering. An etching treatment was used to form through holes of diameter 200 µm in the copper film, which were treated as pinholes. The polyimide film was then subjected to alkali treatment and a polymer formation treatment, thus forming a conductive organic polymer coating inside the pinholes. Copper sulfate plating was then used to deposit a copper layer on top of the conductive organic polymer coating. The polymer formation treatment was conducted using the procedure and conditions described below.

(1) Degreasing

The alkali treated film was degreased with an acidic degreasing solution. The acidic degreasing solution was an aqueous solution comprising 50 mL/L of Aktipur AS (a trademark of Enthone Inc.) and 50 mL/L of sulfuric acid, and the film was immersed in this acidic degreasing solution for 60 seconds at room temperature, and was then washed with water.

(2) Conditioning

The degreased film was immersed in an aqueous solution comprising 20 mL/L of ENVISION DMS-E Conditioner 7015 (a trademark of Enthone Inc.) for 120 seconds at 40° C., and was then washed with water.

(3) Oxidation Treatment

The conditioned film was immersed in an aqueous solution comprising 65 g/L of potassium permanganate and 10 g/L of boric acid for 180 seconds at 70° C., and was then washed with water.

(4) Catalyst Treatment

Figure 4:
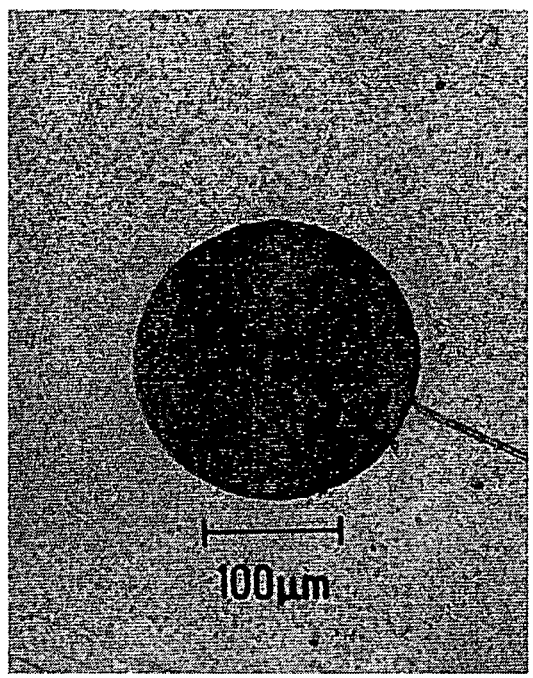
FIG. 4 is a photograph from a microscope showing a conductive organic polymer coating formed within a pinhole.

The oxidation treated film was immersed in an aqueous solution comprising 20 mL/L of ENVISION DMS-E Catalyst 7050A (a trademark of Enthone Inc.) and 45 mL/L of ENVISION DMS-E Catalyst 7050B (a trademark of Enthone Inc.)

from the ENVISION DMS-E (a trademark of Enthone Inc.) system, for a period of 240 seconds at room temperature, and was then washed with water. A photograph taken through a microscope at this point is shown in FIG. 4. The dark colored section corresponds with a pinhole, and it is evident that a conductive organic polymer coating has been formed within this pinhole.

(5) Copper Sulfate Plating

Figure 5:
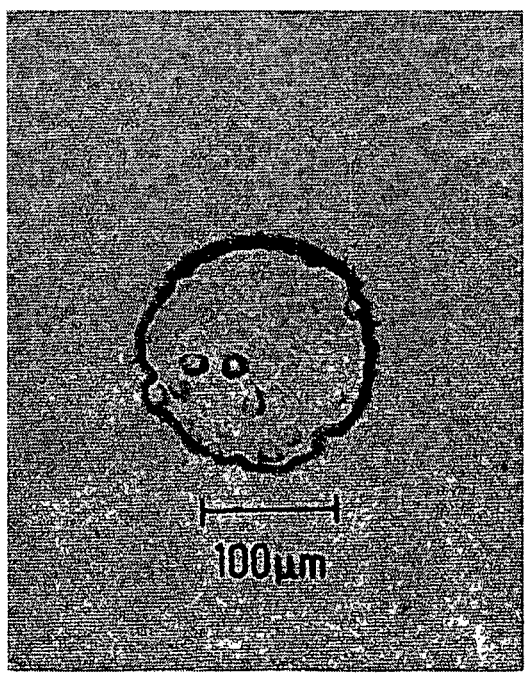
FIG. 5 is a photograph from a microscope showing a copper plating layer formed on top of the conductive organic polymer coating within the pinhole.

The film with the polymer formed thereon was immersed in an aqueous solution comprising 100 g/L of copper sulfate and 200 g/L of sulfuric acid, and with the plating solution undergoing air agitation, electroplating was conducted at a solution temperature of 25° C. with a current density of 2 A/dm$^2$, thus forming a copper plating layer on top of the conductive polymer coating. A photograph taken through a microscope at this point is shown in FIG. 5. It is evident that the copper plating formed above the pinhole displays a similar surface state to the copper plating formed in the region outside the pinhole.

The peel strength of the copper plating layer of the copper plated polyimide film produced using the production process described above was measured. Three strip specimens of width 10 mm and length 150 mm were cut from the polyimide film. Of these specimens, the first was not subjected to any heat treatment, the second was subjected to heat treatment at 150° C. for 168 hours, and the third was subjected to heat treatment under conditions of high humidity (PCT treatment) (relative humidity 98%, 121° C. for 24 hours). In separate preparations, other copper plated polyimide film specimens were prepared in the same manner as described above, but with the exception of not performing the conductive polymer formation treatment.

The peel strength between the film substrate and the metal film for each of these six copper plated polyimide film specimens was measured in accordance with the method disclosed in IPC-TM-650 (the test method prescribed by IPC-Association Connecting Electronics Industries). In this test method, the polyimide film side of each of the above strip specimens was bonded around the circumferential direction of the exterior of a 6 inch diameter drum, and one end of the metal film was then pulled away from the polyimide film at a rate of 5 cm/minute using a jig, while the load required to achieve the peeling was measured. The test results are shown in FIG. 6.

Figure 6:
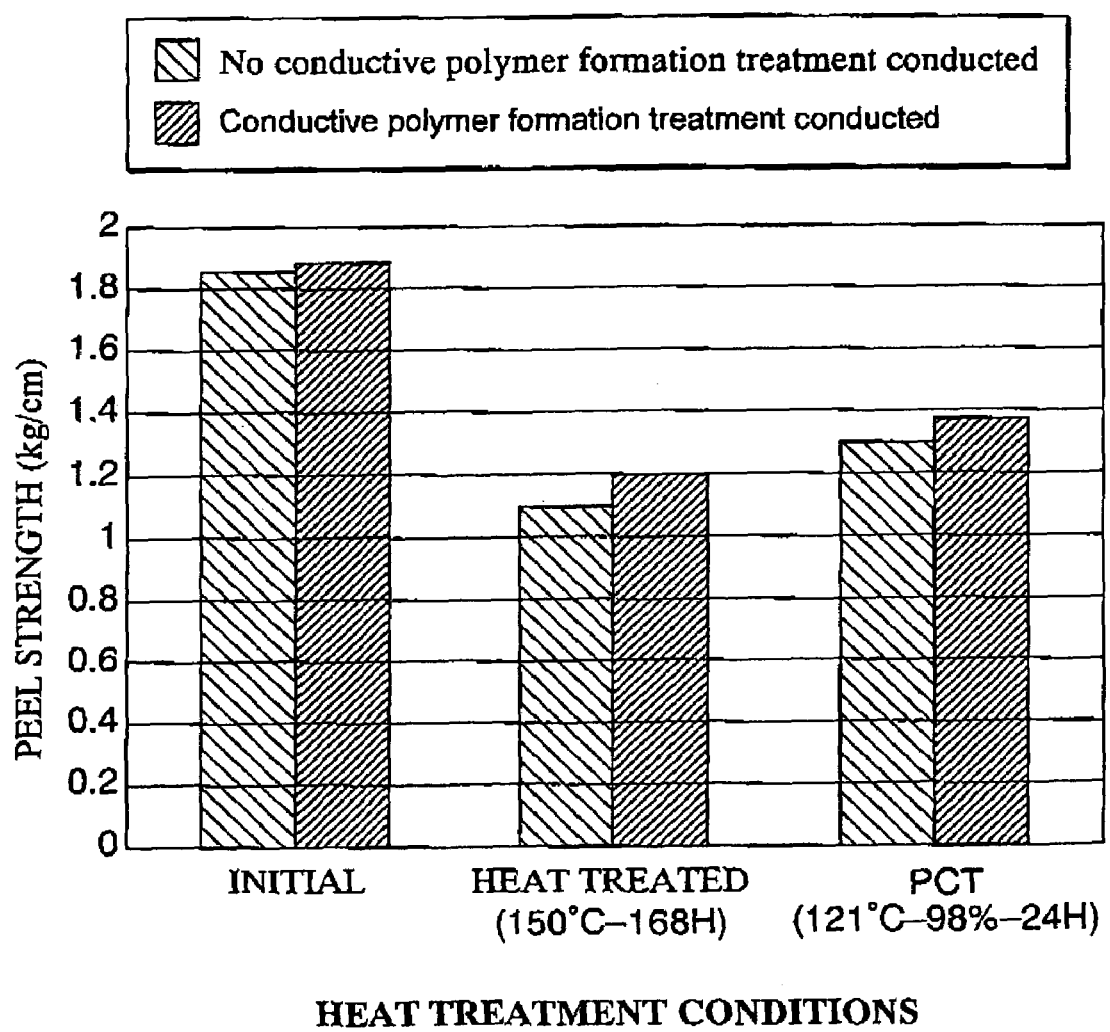
FIG. 6 is a graph of peel strength values for copper plating layers, comparing specimens comprising a conductive organic polymer coating, and samples without such a coating.

As shown in FIG. 6, the peel strength (peak intensity) values for the copper plating layers from the copper plated polyimide films in which a conductive organic polymer coating had been formed compared favorably with the copper plated polyimide films with no conductive organic polymer coating.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A metal layer formation process for forming a metal layer on a surface of an insulator, comprising the steps of:
    forming a base metal film on a surface of said insulator using a dry plating process,
    coating pinhole defects within said base metal film by bringing a liquid containing an organic monomer into contact with a surface of said insulator on which said base metal film has been formed, thus selectively forming a conductive organic polymer coating on said insulator surface inside said pinhole defects, and
    following coating of said pinhole defects with said conductive organic polymer coating, forming a metal film on top of said base metal film using an electroplating process or an electroless plating process, thus forming a metal wet plating layer.

2. A metal layer formation process according to claim 1, wherein said dry plating process is any one of sputtering, vacuum deposition, and ion plating.

3. A metal layer formation process according to claim 1, wherein said insulator is a plastic film.

4. A metal layer formation process according to claim 1, further comprising, prior to said step for forming said base metal film,
    a step for forming a layer of one or more materials selected from a group consisting of Mo, Cr, Ni, Si, Fe, Al, and actual alloys formed from two or more of said elements, with a thickness within a range from 0.2 mg/m$^2$ to 90 mg/m$^2$.

5. A metal layer formation process according to claim 1, wherein said conductive organic polymer has a polyacetylene structure.

6. A metal layer formation process according to claim 1, wherein said conductive organic polymer coating is formed by an oxidation polymerization of an organic monomer.

7. A metal layer formation process according to claim 1, wherein said organic monomer is an aniline, a pyrrole, or a thiophene based compound.

8. A metal layer formation process according to claim 1, wherein a surface resistance of said conductive organic polymer coating is within a range from 10 Ω/cm to 1 MΩ/cm.

9. A metal layer formation process according to claim 1, wherein a thickness of said conductive organic polymer coating is not more than 0.2 μm.

* * * * *

UNITED STATES PATENT AND TRADEMARK OFFICE
CERTIFICATE OF CORRECTION

| | | |
|---|---|---|
| PATENT NO. | : 7,416,763 B2 | Page 1 of 1 |
| APPLICATION NO. | : 10/870671 | |
| DATED | : August 26, 2008 | |
| INVENTOR(S) | : Yuichi Kanda et al. | |

It is certified that error appears in the above-identified patent and that said Letters Patent is hereby corrected as shown below:

On the front page, at Field (73), "Cookson Electronics Co., Kanagawa (JP)" should be -- Cookson Electronics Co., Kanagawa (JP) and Mitsubishi Shindoh, Co., Ltd., Tokyo (JP) --.

Signed and Sealed this

Fifth Day of May, 2009

JOHN DOLL
*Acting Director of the United States Patent and Trademark Office*